(12) United States Patent
Schisler et al.

(10) Patent No.: US 7,725,420 B2
(45) Date of Patent: *May 25, 2010

(54) SYSTEMS FOR PREDICTING SPORTING SUCCESS CONDITIONS

(75) Inventors: George J. Schisler, Wellington, CO (US); Eric P. Bergersen, Fort Collins, CO (US); David L. Laylin, Great Falls, VA (US)

(73) Assignee: Speedtech Instruments, Sterling, VA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/370,837

(22) Filed: Feb. 13, 2009

(65) Prior Publication Data

US 2009/0149975 A1    Jun. 11, 2009

Related U.S. Application Data

(63) Continuation of application No. 10/480,746, filed as application No. PCT/US02/18604 on Jun. 12, 2002, now Pat. No. 7,536,375.

(60) Provisional application No. 60/297,801, filed on Jun. 12, 2001.

(51) Int. Cl.
G06F 15/00 (2006.01)
G06F 15/18 (2006.01)

(52) U.S. Cl. .......................................... 706/62; 706/21

(58) Field of Classification Search .............. 706/62
See application file for complete search history.

(56) References Cited

U.S. PATENT DOCUMENTS

| | | | |
|---|---|---|---|
| 2,532,061 A | 11/1950 | Glick | |
| 4,445,178 A | 4/1984 | Scheer et al. | |
| 5,208,790 A | 5/1993 | Sato | |
| 5,978,738 A | 11/1999 | Brown | |
| 6,076,044 A | 6/2000 | Brown | |
| 6,222,449 B1 | 4/2001 | Twining | |
| 6,597,990 B2 | 7/2003 | Brown | |
| 7,536,375 B2* | 5/2009 | Schisler et al. | 706/62 |
| 2002/0226284 | 2/2002 | Brown | |

FOREIGN PATENT DOCUMENTS

| | | |
|---|---|---|
| CN | 1089037 A | 7/1994 |
| WO | 02101332 A1 | 12/2002 |

OTHER PUBLICATIONS

Office Action dated Mar. 9, 2007 in parallel Chinese patent application No. 02814535.6.
U.S. Appl. No. 10/480,476, filed Dec. 11, 2003, entire file wrapper available on line.
International Patent Application No. PCT/US02/18604, International Search Report dated Dec. 23, 2002.
International Patent Application No. PCT/US02/18604, International Preliminary Examination Report dated Mar. 23, 2003.
U.S. Appl. No. 60/297,801, filed Jun. 12, 2001.
US 5,867,805, 02/1999, Brown (withdrawn)

* cited by examiner

*Primary Examiner*—Michael B Holmes
(74) *Attorney, Agent, or Firm*—Santangelo Law Offices, PC

(57) ABSTRACT

A hand held or portable device (1) is configured to include a multitude of factors from which sporting success conditions such as applicable to fishing and hunting success may be predicted. In one embodiment, these may include: a lunar information element (2), a solar information element (3), a barometric information element (4), and a temperature information element (5) that provide input (directly or indirectly) to combination elements (6) and a sport success prediction element (7) that may provide a simplistic or other display (8) to a user. A composite barometric-lunar-solar-temperature effect may be calculated for the present or for a remote time and date through a future time forecast element (17).

20 Claims, 10 Drawing Sheets

SYSTEMS FOR PREDICTING SPORTING SUCCESS CONDITIONS

This application is a continuation of U.S. patent application Ser. No. 10/480,746 filed Dec. 11, 2003 which is the U.S. National Stage of International Application No. PCT/US02/18604, filed Jun. 12, 2002, which claims the benefit of U.S. Provisional Application No. 60/297,801, filed Jun. 12, 2001, each hereby incorporated by reference.

TECHNICAL FIELD

This invention relates to providing sports participants and others such as fishermen or hunters and the like an indication of the relative feeding activity, movement activity or the like of animals and thus it relates to providing an indication of the relative success conditions that could be occurring at any given time or location. It can act to temporally predict success (or more precisely success conditions) at any event affected by a variety of specific factors.

BACKGROUND

Sporting success, that is the ability to achieve a desired outcome in a competitive or man-against-nature context (whether for purely pleasure, for commercial reasons, or the like), can relate to a variety of factors. While, of course, location, skill, knowledge, and experience can be highly influential, there are a host of other factors that can also be influential. Many of these factors can be predicted or measured and as such it is possible to utilize them to relate to either a player or a user the relative impacts and conditions they may experience as a result of those factors. In the specific context of activities such as fishing and hunting, some specific factors can be predicted and utilized. Some of these factors are described by John Alden Knight in the early reference entitled "Moon-Up, Moon-Down", library of Congress number 72-93383.

Other efforts to provide users an amount of information in a user-desired manner have been attempted. U.S. Pat. No. 2,532,061 to Glick discloses an earlier example of one effort relative to this type of application. In that disclosure, a manual wheel device was proposed as providing an ability to allow a user to dial in a variety of information and then attempt to glean an influenced result. It does not, however, adequately provide the user a satisfactory experience in that it requires too great an amount of user activity, does not adequately include a sufficient number of factors, does not adequately develop some of the factors it does reference, and does not adequately display the results to the user in an optimal manner.

A more contemporary effort is shown in U.S. Pat. No. 4,445,178 to Scheer. It discloses an example in which a computer is configured to assist in selecting fishing bait and other decisions. It also does not, however, appropriately include the various factors usually needed for an accurate prediction and is not designed as a hand held device for easy use and interpretation to the degree of the present invention.

Even more recently, an effort is shown in U.S. Pat. No. 5,208,790 to Sato. It discloses an example in which an amount of information was attempted to be calculated and then conveyed to a user in some manner through a watch-like device. It also does not, however, adequately provide the user a satisfactory experience and does not automatically incorporate the factors usually desired for an accurate prediction and does not provide the simplicity of use or interpretation desired. It also does not disclose an ability to permit a user to obtain results that may be applied for a future time, when the particular activity may be conducted.

Thus users are left with a desire to have an adequate variety of information automatically incorporated, displayed, and available in manners which are easily used and assimilated. Although a variety of information has been separately available, it has not been presented in a coherent or combined package, which has been easy to use.

DISCLOSURE OF INVENTION

The present invention provides both apparatus and methods through which predictive results can be obtained relative to the conditions for success in a variety of endeavors. It can be applied in a sporting context in a manner through which at least one factor can be calculated, input, or measured and that factor can then be utilized to predict sport or other success. Although the factors included can be varied in one embodiment, the invention utilizes solar, lunar, and perhaps barometric and/or temperature information to achieve an accurate estimate of the relative sporting success that may be experienced in a particular context. It may be achieved in a hand held device through which a sport success prediction element may be provided to the user at any desired location.

As a hand-held or dash-mounted instrument either used alone or combined with other capabilities (as but one example when combined with a sonar-type fish finder such as for the fishing field) the device may include a LCD or other display showing items such as barometric pressure and trend, moon phase, sun position, air temperature, water temperature, time, date, weather conditions, weather predictions (such as with an icon as in an instrument specifically produced), severe storm warnings (which may include an audible alarm), or even a subset of these parameters. It can also display sporting or perhaps hunting or fishing conditions anticipated to be experienced.

Specific to a fishing embodiment of this invention may be the calculation of fishing conditions—whether for fresh or salt water fishing—based upon a set of parameters and a display of the fishing conditions anticipated. The fishing conditions may be presented in a variety of ways including but not limited to the following:

A sliding scale beginning with a small fish for poor fishing conditions, and ending with a large fish for good fishing conditions, A display of one fish for poor fishing conditions, and multiple fish for good fishing conditions, A display of a bar graph of increasing size, and of course Any other kind of indication representing the current fishing conditions as estimated by software.

It may also use a variety of factors, including, but not be limited to: monthly and daily moon phase, sun position, barometer readings, temperature values, and the like. These may also be used in any combination and even specific factors may be excluded as appropriate in any context.

Two of the more important factors that may be automatically included are the factors relating to both lunar information and solar information. As such the device may include both a lunar information element and a solar information element. By these it is meant that the invention may account for any type of conditions that are either solar influenced or lunar influenced. Any information may be used or applied to achieve an ultimate prediction for the user. The device may then achieve its goal of providing a user with information from which the current or even the most optimal conditions can then be known and acted upon if desired.

Naturally, further objects of the invention are disclosed throughout other areas of the specification and claims.

MODE(S) FOR CARRYING OUT THE INVENTION

Figure 3:
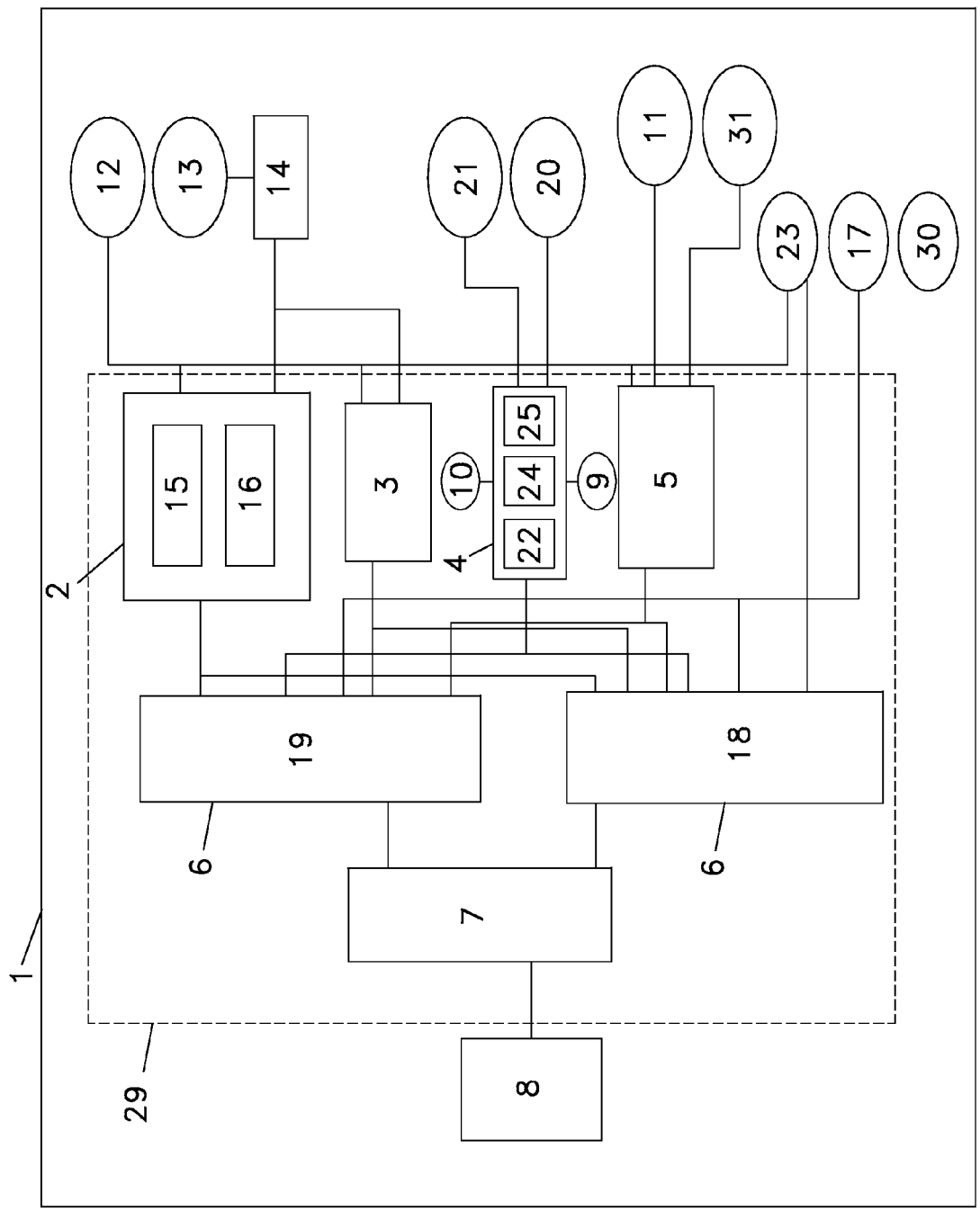
FIG. 3 is a schematic drawing of an embodiment of the invention.
Figure 4:
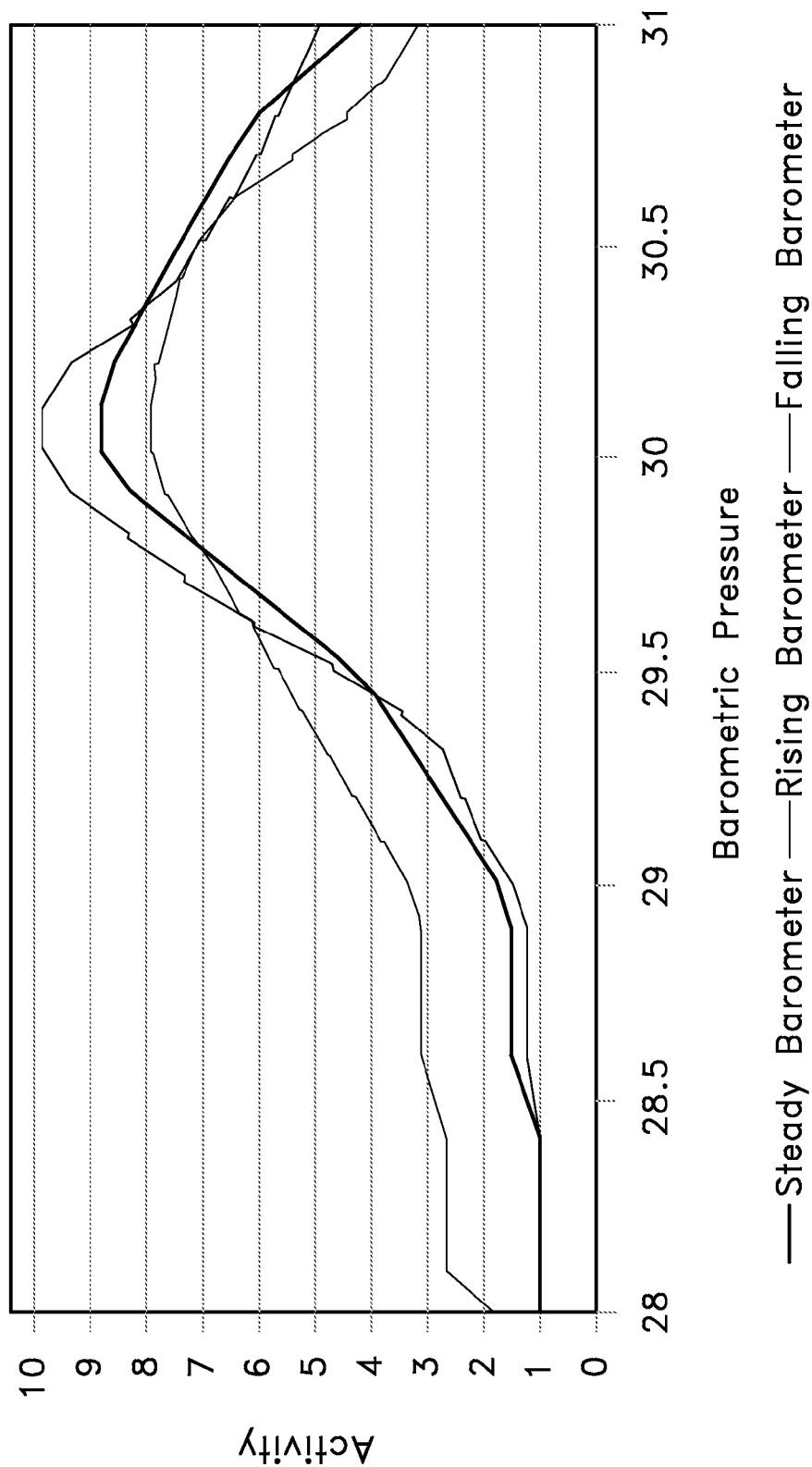
FIG. 4 shows a graph of Fishing Barometric Pressure Effects in accordance with an embodiment of the present invention.
Figure 5:
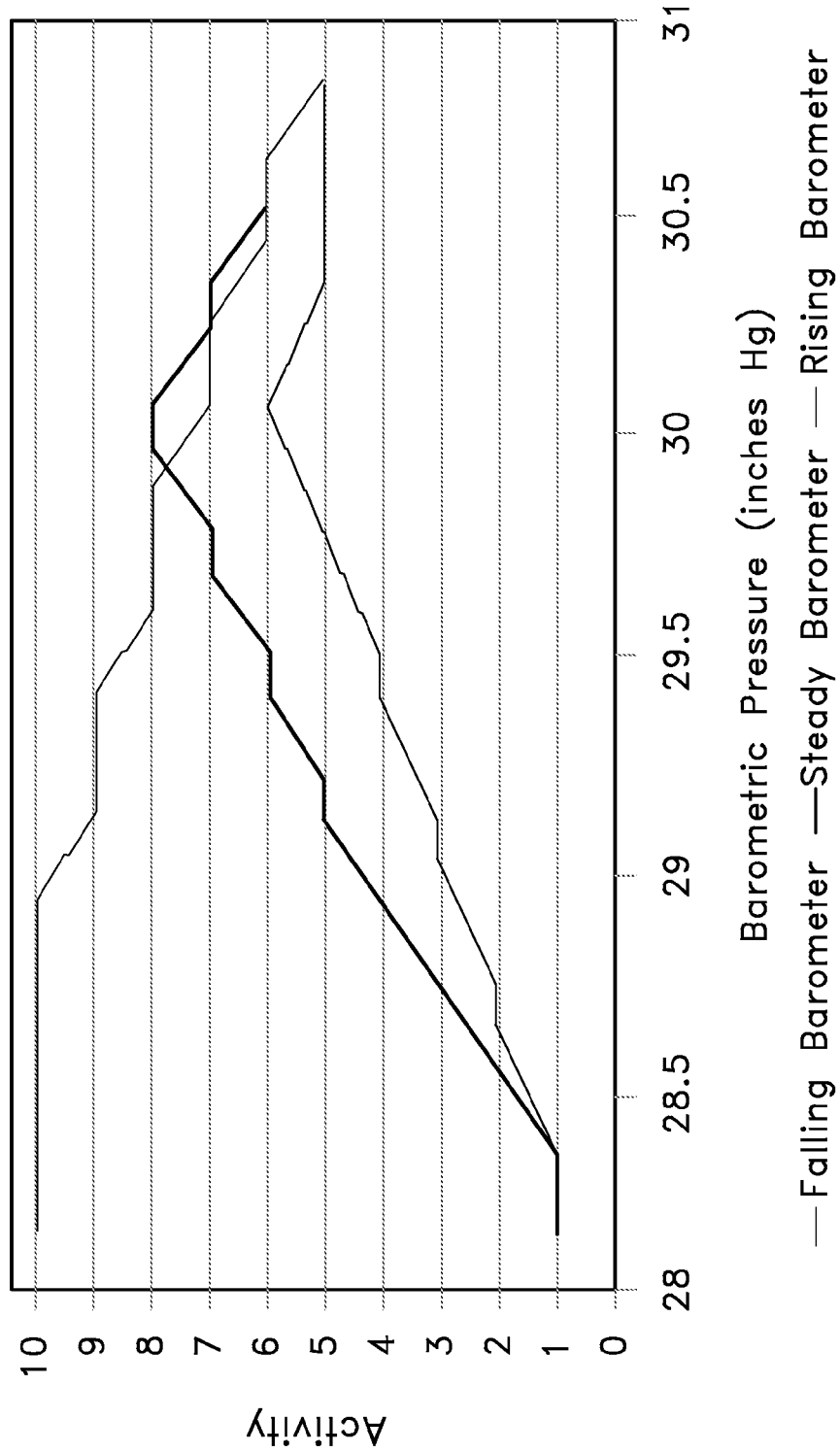
FIG. 5 shows a graph of Large Game Barometric Pressure Effects in accordance with an embodiment of the present invention.
Figure 6:
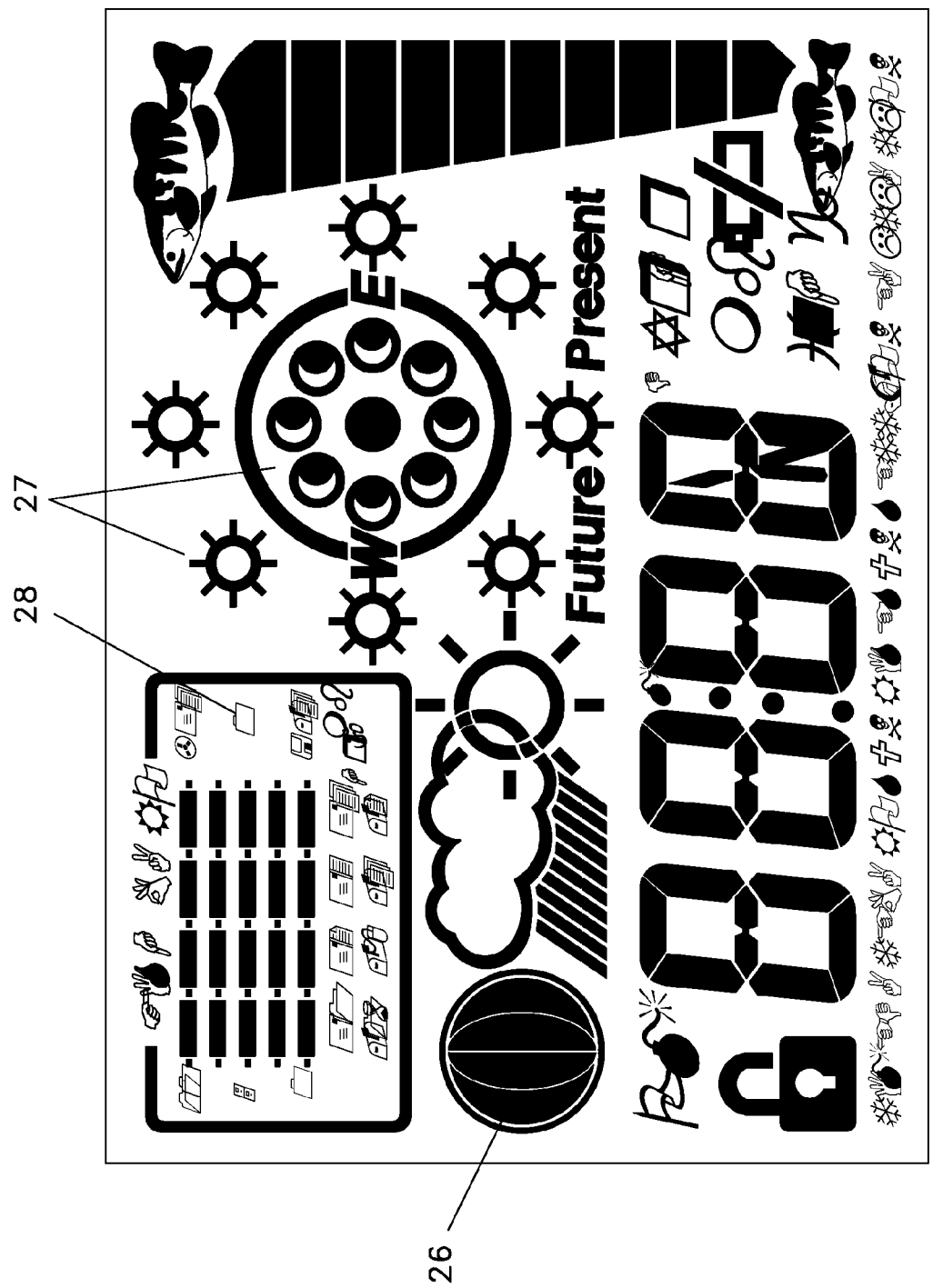
FIG. 6 shows one example of a display in accordance with embodiments of the present invention.
Figure 7:
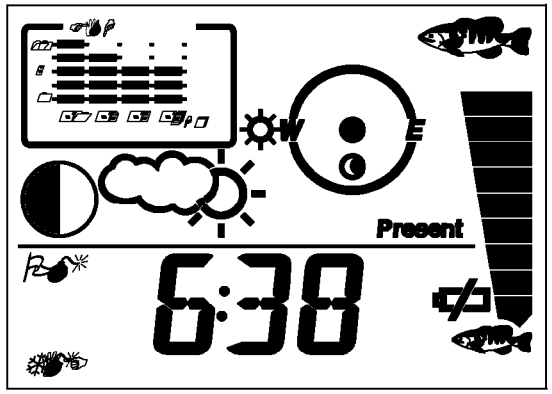
FIG. 7 shows an example of a "Present" Display Mode such as a Present Time display mode (Low Battery) in accordance with embodiments of the present invention.
Figure 8:
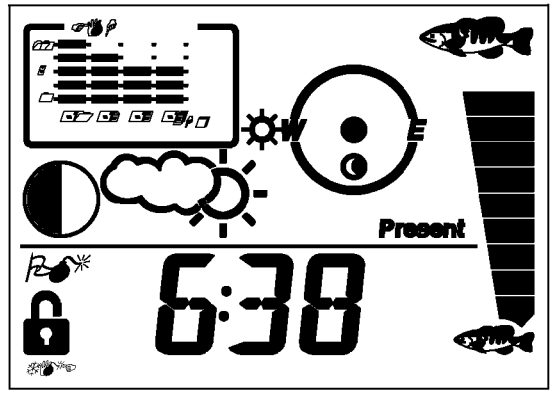
FIG. 8 shows an example of a "Present" Display Mode such as a Present Time display mode (key lock enabled) in accordance with embodiments of the present invention.
Figure 9:
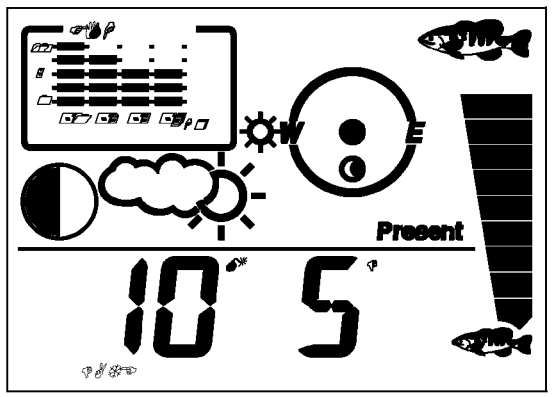
FIG. 9 shows an example of a "Present" Display Mode such as a Present Date display mode in accordance with embodiments of the present invention.
Figure 10:
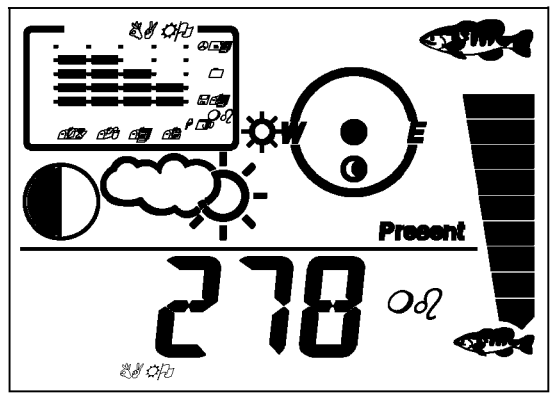
FIG. 10 shows an example of a "Present" Display Mode such as a Present Barometric pressure display mode in accordance with embodiments of the present invention.
Figure 11:
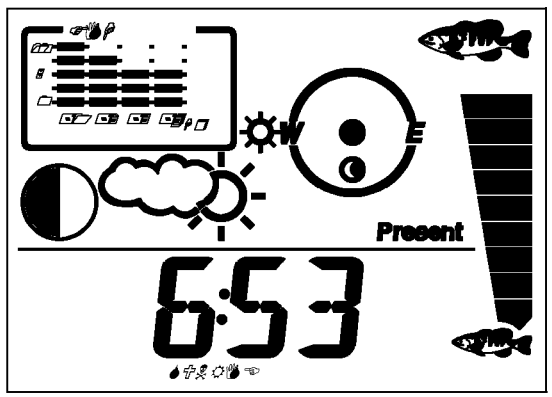
FIG. 11 shows an example of a "Present" Display Mode such as a Present Sunrise time display mode in accordance with embodiments of the present invention.
Figure 12:
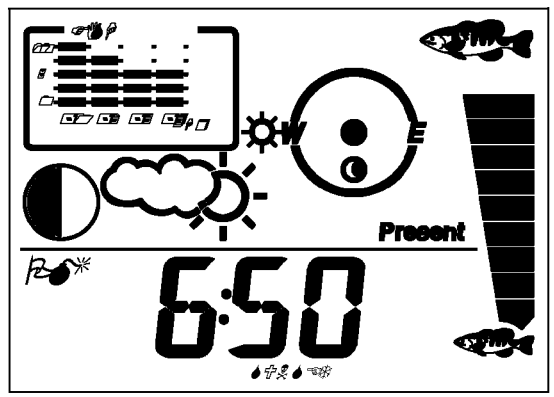
FIG. 12 shows an example of a "Present" Display Mode such as a Present Sunset display mode in accordance with embodiments of the present invention.
Figure 13:
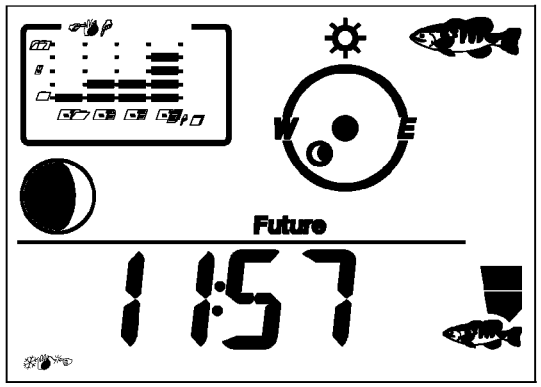
FIG. 13 shows an example of a "Future" Display Mode such as a Future Time mode in accordance with embodiments of the present invention.
Figure 14:
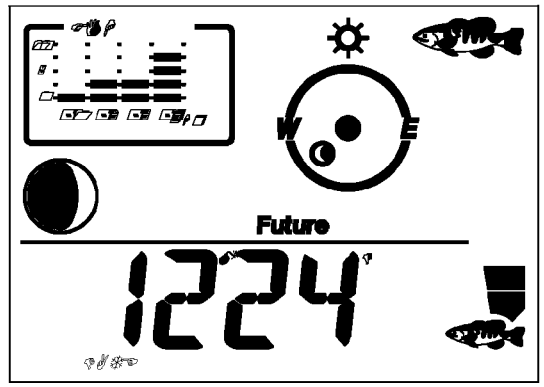
FIG. 14 shows an example of a "Future" Display Mode such as a Future Date mode in accordance with embodiments of the present invention.
Figure 15:
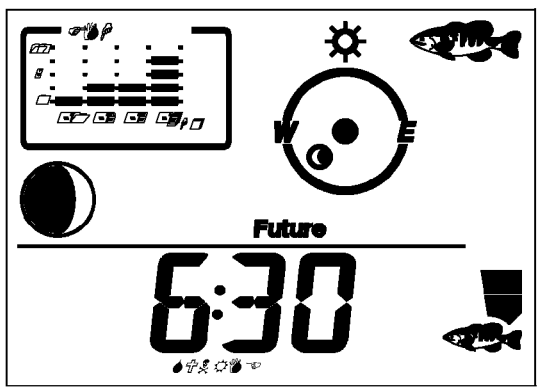
FIG. 15 shows an example of a "Future" Display Mode such as a Future Sunrise time mode in accordance with embodiments of the present invention.
Figure 16:
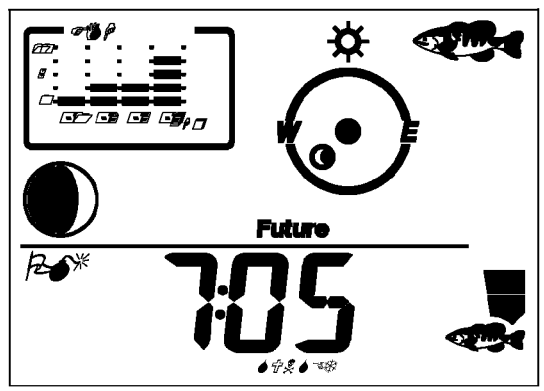
FIG. 16 shows an example of a "Future" Display Mode such as a Future Sunset mode in accordance with embodiments of the present invention.
Figure 17:
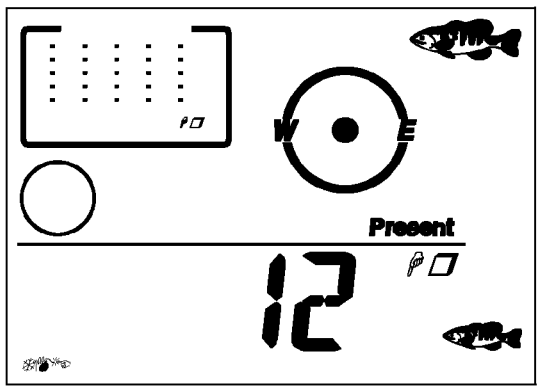
FIG. 17 shows an example of a Present Setting Mode such as a Present time setting mode (12/24 hr format) ("Present" & setting digits flashing) in accordance with embodiments of the present invention.
Figure 18:
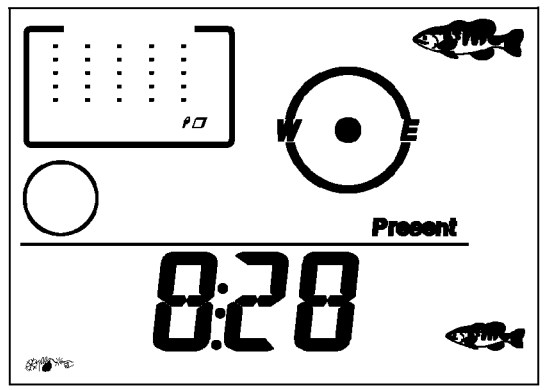
FIG. 18 shows an example of a Present Setting Mode such as a Present time setting mode (Hour & minute) ("Present" & setting digits flashing) in accordance with embodiments of the present invention.
Figure 19:
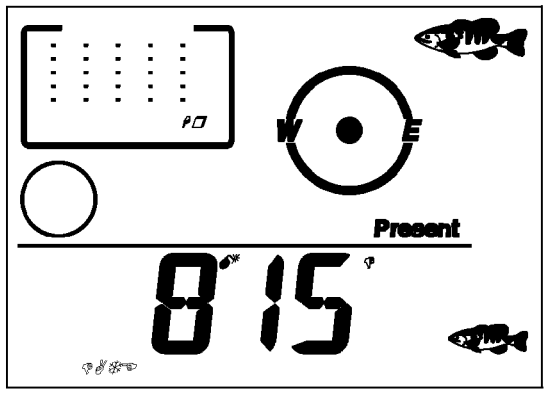
FIG. 19 shows an example of a Present Setting Mode such as a Present date setting mode (Month & day) ("Present" & setting digits flashing) in accordance with embodiments of the present invention.
Figure 20:
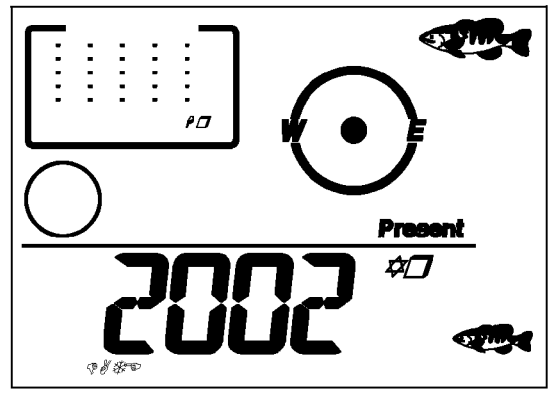
FIG. 20 shows an example of a Present Setting Mode such as a Present date setting mode (Year) ("Present" & setting digits flashing) in accordance with embodiments of the present invention.
Figure 21:
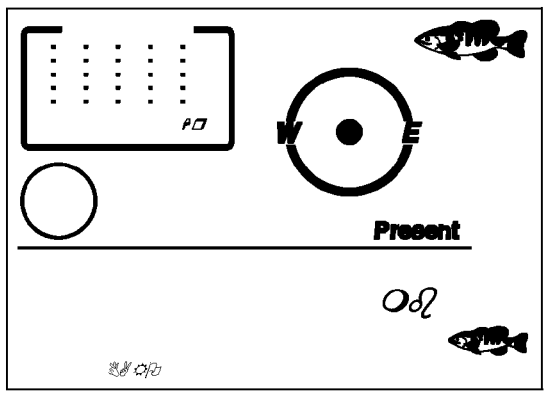
FIG. 21 shows an example of a Present Setting Mode such as a Present pressure unit setting mode (eg. mb) ("Present" & setting digits flashing) in accordance with embodiments of the present invention.
Figure 22:
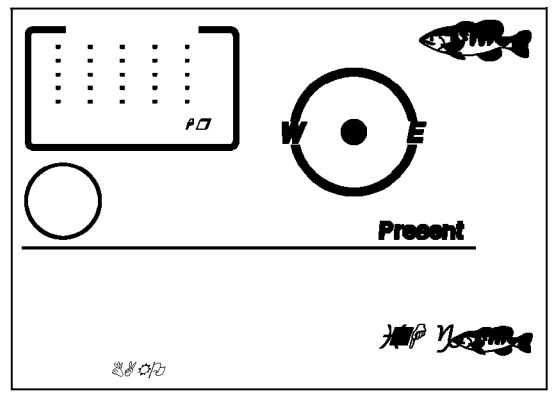
FIG. 22 shows an example of a Present Setting Mode such as a Present pressure unit setting mode (eg. in Hg) ("Present" & setting digits flashing) in accordance with embodiments of the present invention.
Figure 23:
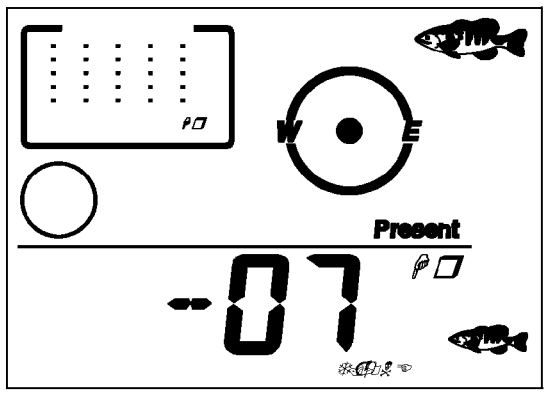
FIG. 23 shows an example of a Present Setting Mode such as a Present Time Zone setting mode (eg. −7 hr) ("Present" & setting digits flashing) in accordance with embodiments of the present invention.
Figure 24:
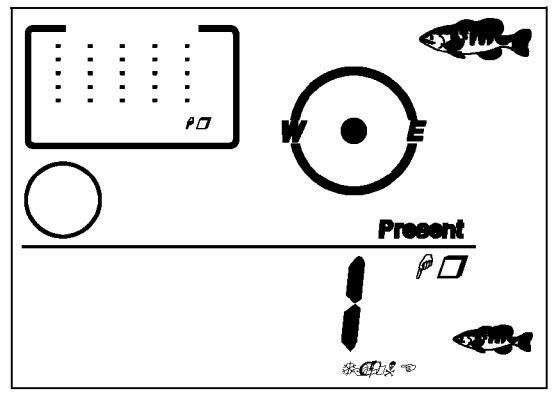
FIG. 24 shows an example of a Present Setting Mode such as a Present Time Zone setting mode (eg. +1 hr) ("Present" & setting digits flashing) in accordance with embodiments of the present invention.
Figure 25:
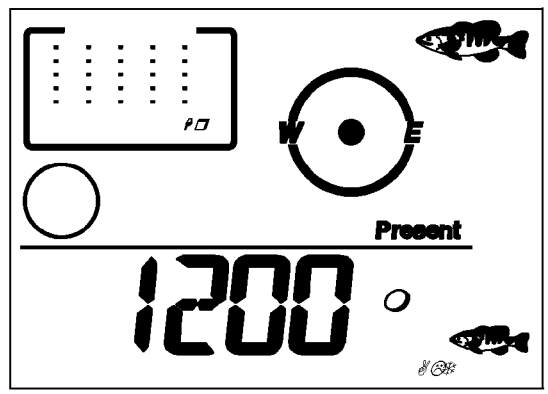
FIG. 25 shows an example of a Present Setting Mode such as a Present Altitude setting mode (eg. 1200 m) ("Present" & setting digits flashing) in accordance with embodiments of the present invention.
Figure 26:
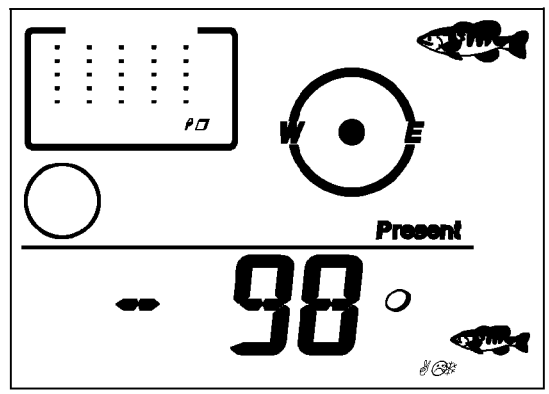
FIG. 26 shows an example of a Present Setting Mode such as a Present Altitude setting mode (eg. −98 m) ("Present" & setting digits flashing) in accordance with embodiments of the present invention.
Figure 27:
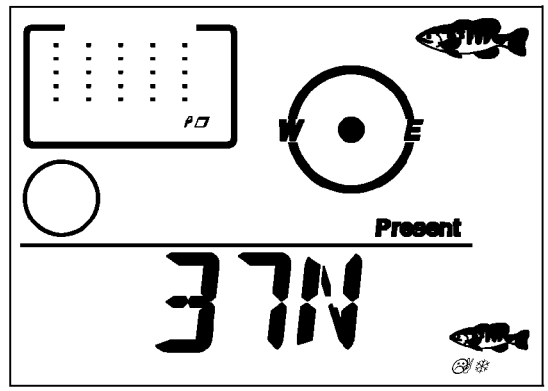
FIG. 27 shows an example of a Present Setting Mode such as a Present Latitude setting mode (eg. 37"N) ("Present" & setting digits flashing) in accordance with embodiments of the present invention.
Figure 28:
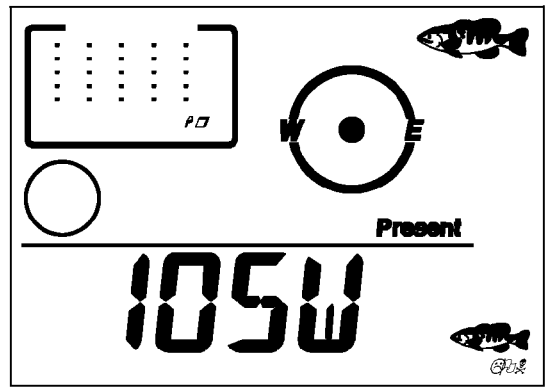
FIG. 28 shows an example of a Present Setting Mode such as a Present Longitude setting mode (eg. 105" W) ("Present" & setting digits flashing) in accordance with embodiments of the present invention.
Figure 29:
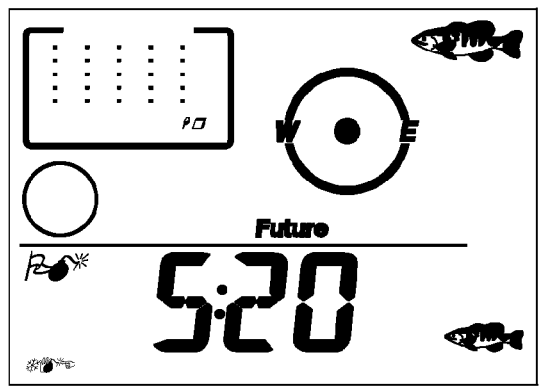
FIG. 29 shows an example of a "Future" Display Setting Mode such as a Future time setting mode (Hour & Minute) ("Future" & setting digits flashing) in accordance with embodiments of the present invention.
Figure 30:
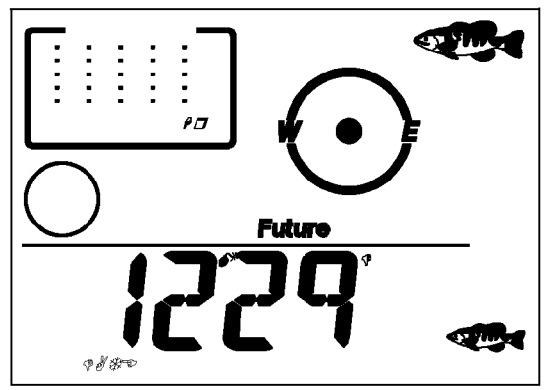
FIG. 30 shows an example of a "Future" Display Setting Mode such as a Future setting mode (Month & Date) ("Future" & setting digits flashing) in accordance with embodiments of the present invention.
Figure 31:
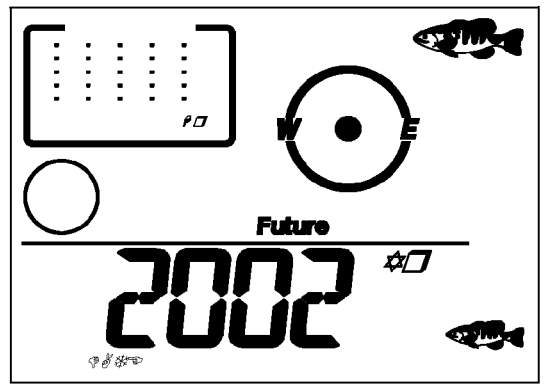
FIG. 31 shows an example of a "Future" Display Setting Mode such as a Future Date setting mode (Year) ("Future" & setting digits flashing) in accordance with embodiments of the present invention.

As can be seen from the drawings, the basic concepts of the present invention may be embodied in many different ways. FIG. 3 shows a schematic of one embodiment of the invention as configured to include a multitude of factors and information. The device may be designed as a hand held or portable device (1) which accomplishes all or part of the desired functions. In keeping with the broad nature of the invention naturally it should be understood that any number of factors or information may be included or excluded in any embodiment. These may include: lunar information or a lunar information element (2), solar information or a solar information element (3), barometric information or a barometric information element (4), temperature information or a temperature information element (5), or even other factors. Each of these may provide input (including directly or indirectly) to one or more combination elements (6). The one or more combination elements (6) may then in turn provide input to a sport success prediction element (7) which may then in turn provide input to a display or other output (8).

The combination element or elements (6) may act to create or otherwise cause a variety of composite or individual effects or may generate values representative of such effects. These may include a composite barometric-lunar-solar-temperature effect as in the example shown or may be more or less complex. For example, the following effects may be included in any design: a composite barometric-lunar-solar effect, a composite lunar-solar effect, a composite temperature-lunar-solar effect, a composite barometric-lunar-solar effect, a composite barometric-lunar effect, a composite barometric-lunar-solar effect, or simply a barometric effect or a solar effect. These may then be utilized by an element that provides a signal or value representative of the ultimate indication, such as the prediction element (7) as shown.

With respect to the barometric information element (4), a variety of functions can be accomplished. These may include, but are not limited to, the functions of estimating a weather forecast character and even alerting a user of a potentially severe weather condition. As shown, these can be accomplished through the inclusion of a weather forecast element (9) and even a severe weather alarm (10). Crude or detailed weather forecast functions can be accomplished through outside signals or through the inclusion of a barometric assessment as are well known. Of course this may be displayed in some fashion for the user's benefit. The severe weather alert function may be similarly accomplished and perhaps may be achieved through a determination of a falling barometer threshold such as a set amount in a set time period. In such an embodiment, there may also be provided some method of dealing with altitude changes such as including a reset when changing altitude or the like to avoid a false severe weather alert or alarm.

As shown in FIG. 3, a temperature information element (5) may, but need not, also be included. This may be accomplished by an input or an external temperature sensor (11) or probe which may be permanently or temporarily attached to the instrument to measure outdoor or water temperature.

As shown in FIG. 3, sporting location determinative information may, but need not, also be included through some type of location determinative information element (12). This location determinative information element (12) may act to provide information through an estimate of the precise location at which the desired sporting or other event may occur. In this regard, a variety of inputs are possible and are discussed later.

The sporting location determinative information may be used for a variety of purposes such as determining altitude, latitude and longitude location or the like and may be an input through which more precise information such as the lunar or solar information may be calculated. In addition, it may be helpful to have time and perhaps date information. Thus, the device may be designed to include appropriate inputs such as perhaps a clock (13), a date information element (14), or the like.

In utilizing a variety of factors, it should be understood that the device may merely account for an influence; it need not actually generate a separate value for any one factor. For some factors it may be appropriate to provide for a plurality of daily or other periodic maximum success event factor elements. These may be accomplished through software, hardware, or even firmware configuration or designs. In this regard, it should be understood that each element need not be a physically separate component, it may merely be a subroutine or other portion of code which accomplishes the desired function even if not separately delineatable. These elements may act to calculate, provide, or utilize a maximum success event factor, which is within a range or occurs upon a particular event. Such a factor may be algorithmically or tabularly derived.

As mentioned to earlier, the instrument may account for lunar position effects. It may use daily (moonrise and moonset) and monthly (full moon, new moon, quarter moon) moon phases to estimate a coefficient for fishing success due to current moon phase. Lunar position may be accounted for through inclusion of a lunar position element (15). Daily and monthly moon phase may be calculated based on a program that may estimate moon position and phase based on geographical location, date, and/or current time of day. As such it may act in a manner which accounts for lunar position influenced predictions. In one embodiment it may provide a plurality of daily, lunar influenced maximum success event factor elements as code or functions included in lunar information element (2). These may include an overhead daily maximum success event factor, an underfoot daily maximum success event factor, a moonrise daily maximum success event factor, and a moonset daily maximum success event factor. Each may of course be provided by a corresponding element.

By the term "element" it should be understood that the term is intended to broadly encompass a great variety of items and functionality which merely achieves the desired result whether separately or merely as part of a greater overall function even if the element is not separately identifiable from an overall or other functioning component or item. Thus in a software embodied design, the code may include an overhead daily maximum success factor element, an underfoot daily maximum success factor element, a moonrise daily maximum success factor element, and a moonset daily maximum success factor element or the like.

Lunar phase influenced effects may also be included. Lunar phase may be accounted for through inclusion of a lunar phase element (16). The design may provide for a plurality of lunar phase maximum success event factor elements such as a new moon maximum success event factor being assessed through the inclusion of a new moon maximum success factor element, a full moon maximum success event factor such as a full moon maximum success event factor being assessed through the inclusion of a full moon maximum success factor element, a one-quarter moon maximum success event factor such as a one-quarter moon maximum success event factor being assessed through the inclusion of a one quarter moon maximum success factor element, and a three-quarter moon maximum success event factor such as a three-quarter moon maximum success event factor being assessed through the inclusion of a three quarter moon maximum success factor element.

Solar position influenced effects may also be included through the use of some type of solar information element (3). The instrument may use sunrise and sunset times to estimate a coefficient for possible fishing success due to sun position. Daily sunrise and sunset times may be calculated based on a program that may estimate these times based on geographical location, date, and/or current time of day. Thus solar position influenced effects can be accommodated. The device may be configured to accomplish this in an automatic fashion and may thus achieve automatically utilizing solar information in its predictive function. This may be accomplished by establishing a plurality of daily maximum success event factors and even may include a plurality of daily, solar influenced maximum success event factor elements within solar information element (3).

The manner in which the solar information may be incorporated may be by establishing a plurality of maximum factors. These may include a sunrise daily maximum success event factor and a sunset daily maximum success event factor and each may be incorporated through some type of sunrise daily maximum success factor element and sunset daily maximum success factor element. Each of these may be based upon date information and location information either input to or sensed by the system.

As shown in FIG. 3, location determinative information element (12) may be any type of capability from which location information, whether precise location or location estimates, can be deduced. This may be as precise as configuring the system to accept latitude and longitude inputs. Other inputs are also possible, including but not limited to a time zone input, nearby location input (such as a major city or county), or a state or country input. Specific sensing may also be accomplished such as utilizing GPS signals or a GPS signal sensor as part of the location determinative information element (12).

In developing the specific factors included, it may be desirable to configure the system for either a look up function or a mathematically processed function. Either may be encompassed by the aspect of calculating or by the element of a calculation element. For solar and lunar information, it may be particularly efficient to keep the design as practical and cost-effective as possible. Thus the factors may be calculated through the use of formulas. Regardless as to how arrived at; some factors may regularly vary such as sinusoidally varying. They may also be approximated and may even be linearly varied if desired. Thus the system may include a solar information calculation element, a lunar information calculation element or other calculation elements depending upon the factor included. Note that in this regard, an information element, and a calculational element, and even an inclusion element may all be the same component or feature in a given design.

One of the goals of the invention is to provide a system that requires little input from the user and is relatively automatic in its functions. There may be a variety of automatic inclusion elements such as an automatic lunar factor inclusion element, an automatic barometric factor inclusion element, and an automatic solar factor inclusion element. These elements may not need anything other than a rudimentary input or authorization from the user to achieve the function desired automatically.

A significant aspect of the invention may be forecasting a sporting success event in the future. A prediction element may be configured to respond to a future time or date through the inclusion of a future time forecast element (17). This may include a future time and/or date input that may be accepted by the system. High success dates and times or other such events may be requested and one or more upcoming events may be output to the user. Of course specific dates and times may be input to evaluate the conditions at that time. Rather than presenting success conditions for an immediately upcoming time the system may be able to achieve the calculation for a remote time such as through a remote time forecast element. This remote time might even be in the future or in the past if desired.

In achieving a forecast of conditions for a remote time, the system may provide a different criteria predictive element (18) in order to incorporate only those factors appropriate to a forecast. For example, the different criteria predictive element (18) may utilize different criteria than utilized for a present time because some of the factors are simply too unpredictable. Thus a contemporaneous time sport success prediction element (19) may include sensed or input, unpredictable factors and the different criteria predictive element (18) may specifically avoid such factors through inclusion of an unpredictable factor avoidance element. By avoiding very temporally distant unpredictable factors more accuracy may be achieved (albeit even if less that a contemporaneous prediction). Examples of this functionality may include avoiding weather-related factors through a weather-related factor avoidance element, and even avoiding barometric information factors or the like.

In instances in which barometric information is desired to be included, the instrument may use current barometric pressure and even may include a barometric pressure trend to estimate a coefficient for possible success due to barometric pressure. Barometric pressure and even trend may be calculated by an internal barometer or may be input to the system. Barometric information may be input through a barometric information element (4) and significantly this may be accomplished automatically through an automatic barometric factor element rather then through some user input or activities to keep the system as simple as possible. In assessing the success factor to assign, the system may include at least one barometric influenced factor that may be incorporated through a barometric influenced maximum success event factor element. For pressure concerns, this may be a barometric pressure value success factor (through a barometric pressure value success factor element). The system may be configured for sensing barometric pressure through a barometric pressure sensor (20) or the like. The factor may be assessed through use of a configuration or element that predicts maximum success in a range of barometric pressures as discussed in detail later. Future barometric pressure values (perhaps only for the near term future, e.g., up to four or so hours) may be estimated if desired through the use of regression techniques using past or present pressure and trend.

Because absolute pressure varies with altitude, the system may use an altitude-adjusted barometric pressure element. Altitude determinative information may be used in this feature to correct for a sea level pressure equivalent. These altitude-adjusted barometric pressures may then be used for the calculation through the inclusion of an altitude determinative information element (21) perhaps in conjunction with the location determinative information element (12).

For barometric rate of change concerns, the invention may include or create a barometric pressure value success factor or a barometric pressure success factor such as through a barometric pressure value success factor element (25) or a barometric pressure change success factor element (24). This may be accomplished by calculating a rate of barometric pressure change perhaps by comparing to a memory or other historical barometric information element (22) that contains historical barometric information. For fishing or other such activities, the trend-based success factor may vary by which range of pressures are being experienced. For example, success event factors may be: highest for a falling barometric pressure value, lesser for a steady barometric pressure value, and lesser yet for a rising barometric pressure value when in the most favorable range of pressures; highest for a rising barometric pressure value, lesser for a steady barometric pressure value, and lesser yet for a falling barometric pressure value when in a range of pressures which are lower than the most favorable range of pressures; and highest for a steady barometric pressure value, lesser for a falling barometric pressure value, and lesser yet for a rising barometric pressure value when in a range of pressures which are higher than the most favorable range of pressures. This may be tabularly displayed conceptually as the following for various rates of pressure change (dP/dt) whether falling (−dP/dt), steady (0), or rising (+dP/dt):

|  | Actual Pressure Condition Being Experienced | | |
| --- | --- | --- | --- |
|  | Lower | Optimal | Higher |
| Highest Probability: | +dP/dt | −dP/dt | 0 |
| Lesser Probability: | 0 | 0 | −dP/dt |
| Lowest Probability: | −dP/dt | +dP/dt | +dP/dt |

These concepts are also graphically displayed in more detail in the plots accompanying Exhibits A and B. Of course any of these combinations may be used in a particular model as well. Thus the most general statement is that the success event factor may vary not only due to pure pressure values, but also due to direction or even rate of pressure change concerns.

Of course, different animals may react differently. Fish may react differently due to different factors than deer. Thus the system may accept at least some animal species information. Consistent with the goal of easy use, general animal class information (or equivalently a specific activity) may be input by the user through an animal species information input (23). The animal species information input may be configured to be a general animal class information input or the like.

As mentioned above, the coefficients may be combined into a formula to calculate the relative fishing, hunting, or sporting success that should be occurring at the present time. As but one example, the formula may be based on the following:

1) Increasing possible sporting, fishing, or hunting success near or on a full, new and quarter moon, with reduced fishing success at times in between.
2) Increased possible sporting, fishing, or hunting success at or around moon-rise and moon-set, moon overhead and moon underfoot, with a reduced fishing success at times in between.
3) Increased possible sporting, fishing, or hunting success at or around sunrise and sunset, with reduced fishing success at times in between.
4) Increased possible sporting, fishing, or hunting success at or around 29.8 inches Hg to 30.2 inches Hg (adjusted for altitude) with decreasing sporting, fishing, or hunting success above or below that range.
5) Increasing or decreasing possible sporting, fishing, or hunting success depending on the barometric pressure trend and current barometric pressure.
6) Increasing possible sporting, fishing, or hunting success at water or outdoor temperatures optimal for feeding behavior or activity in individual species of animals (including perhaps even humans), and reduced sporting, fishing, or hunting success at water or outdoor temperatures above or below optimal for feeding behavior or activity of individual species. Thus, sporting success may be indirectly predicted due to the behavior of the particular species involved, whether it be feeding behavior (such as in the fishing example) or merely animal activity (such as in the hunting example).

In addition, the following may be some criteria for assigning values to the individual parameters:

1) Each parameter may be assigned a value of 1-10 based on the expected fishing success due to the current condition represented by each parameter where 1 is the worst condition and perhaps the lowest value for each parameter and 10 is the best condition for that parameter. These values and the like may be as represented tabularly in the attached Exhibit A (barometric values for a fishing embodiment) and Exhibit B (all values for a hunting embodiment). In each Exhibit, it may be noted that in one embodiment, rather than utilizing a zero value, any undefined or out of range values may be considered as a 1 i.e. the minimum value may be 1.
2) Separate valuation curves for the barometric pressure parameter may apply for rising, steady, and falling barometric pressure. All three curves may be relatively bell-shaped, with a skewed-left appearance, peaking between 29.8 inches Hg to 30.2 inches Hg and with a range of near 28 inches Hg to at or near 31 inches Hg. These shapes and the like may be as represented tabularly in the attached Exhibits A and B.
3) The curve for falling barometric pressure may have the highest valuation in the range of 29.8 inches Hg to 30.2 inches Hg. The curve for steady barometric pressure may be slightly lower than that of falling barometric pressure, and the curve for rising barometric pressure may be slightly lower than curve for steady barometric pressure in this range.
4) Below 29.8 inches Hg, a dropping barometric pressure parameter curve may be assigned the lowest valuations, the steady barometric pressure may have a higher valuation than the dropping barometric pressure curve, and the rising barometric pressure curve may have a higher valuation than the steady barometric pressure curve.
5) Above 30.1 inches Hg, the rising barometric curve may have the lowest valuation, the steady barometric pressure curve may have a higher valuation than the rising barometric pressure curve, and the falling barometric pressure curve may have a higher valuation than the steady barometric pressure curve.
6) The moon phase parameter may be assigned the highest value during the full and new moon. The parameter may be assigned a lesser value during the quarter moon. A linear decline in parameter value may occur between these peak phases.

The moon position parameter may be assigned the maximum value during times when the moon is at the 12-hr position (directly overhead) and the 0-hr position (directly underfoot). The moon position parameter may be assigned the maximum value when the moon is at the 6-hr position (moon-rise) and at the 18-hr position (moonset). At times between these peaks, the parameter may even have a linear or other decline in value. The sun position parameter may be assigned maximum value during sunrise and sunset, with a linear or other decline in value at times in between.

Temperature information may also be accommodated through the temperature information element (5). The instrument may include a temperature probe to measure current water or outdoor temperature. Current water temperature may be used to estimate a coefficient for possible fishing success due to water temperature. Similarly, current outdoor temperature may be used to estimate a coefficient for possible hunting success due to activity levels of the particular animal involved. The instrument can be used without the temperature probe, in which case the formula used to calculate the relative fishing success may not use a temperature coefficient and each such function may be automatically included or excluded depending upon the input received. If at least some temperature information is available, the unit may accept input perhaps by sensing at least some temperature information by use of a temperature location input as part of or separate from the temperature information element (5). As shown in FIG. 3, this embodiment may include a temperature sensor (11) as the temperature input.

Because it may be important to know the environment from which the temperature is derived, it may be helpful to include environment information relative to the temperature information. This may be through a temperature environment information input (31) that may be varied as desired. It may be configured to accept a daily temperature range input, a daily high temperature input, a daily low temperature input, or even a temperature location input. This latter aspect may be particularly important because for fish, a water temperature input may be important. As one example, the system may include a warm water fish input such as about 70 degrees Fahrenheit at which a maximum success coefficient is derived, a cool water fish input such as about 65 degrees Fahrenheit at which a maximum success coefficient is derived, and a cold water fish input such as about 55 degrees Fahrenheit at which a maximum success coefficient is derived. Different temperatures may be used for deer or elk and there may be a deer input or an elk input to trigger the inclusion of the appropriate algorithm or the like.

In a fishing embodiment, temperature parameter valuations may even be based on three general curves that represent peak feeding and temperature preferences of warm, cool, and cold water fish. These curves may be bell-shaped, peaking at or near 70 degrees Fahrenheit for warm water fish, at or near 65 degrees Fahrenheit for cool water fish, and at or near 55 degrees Fahrenheit for cold water fish.

As a fishing example, a representative general formula for relative fishing success as calculated by the instrument when a temperature probe is in use may be as follows:

$$0.25B + 0.2M + 0.2P + 0.2S + 0.15T = \text{Fishing Success}$$

where;
B=Barometric Pressure Value
M=Moon Phase Value
P=Moon Position Value
S=Sun Position Value
T=Temperature Value A representative general formula for relative fishing success as calculated by the instrument when temperature probe is not in use and for a current indication or prediction may be as follows:

$$0.295B + 0.235M + 0.235P + 0.235S = \text{Fishing Success}$$

where;
B=Barometric Pressure Value,
M=Moon Phase Value,
P=Moon Position Value, and
S=Sun Position Value.

Similarly, a representative general formula for relative fishing success as calculated by the instrument when temperature probe is not in use and for a forecast or future time indication or prediction may be as follows:

$$\tfrac{1}{3}M + \tfrac{1}{3}P + \tfrac{1}{3}S = \text{Fishing Success}$$

where;
M=Moon Phase Value,
P=Moon Position Value, and
S=Sun Position Value.

As can be seen from the above initial examples, the system may be efficiently configured for an equal weighting of a variety of factors and in one configuration, lunar position, lunar phase, and solar position may each equally be weighted. Thus it may provide for about equivalent daily maximum success event factors. For a forecast mode, it may even equally weight the predictable factors by including a predictive factor equal weight element. This may include an equal weight lunar position factor, lunar phase factor, and solar position factor element. As can also be noticed, the barometric information or factor may be accorded a relatively heavier weight such as an increased 4.5% or the like over a purely equal allocation. This alteration may be varied (by species as well) from a negative variation (e.g., less than the equal factor, 1/n) to a positive amount. Variations for fish might be few percent to a larger amount such as even 2.5%, 4.5%, 5%, 10%, or even 25% or more (the 4.5% value is used in the formula set out above). Variations for big game might be negative to a somewhat positive amount such as even −5%, 0%, +5%, or even +10% or more (the 0% value is used in the formula set out in Exhibit B). Thus a barometric weight element may be used for heavier weighting of the barometric information as compared to each of the other elements.

For simplicity of use, embodiments may provide a user simple conclusionary information. This may be as simple as a meter-based indication such that the sport success prediction meter is easily interpreted. By displaying a bar chart indication or display the unit may be immediately interpreted by the user with little education. Further a simplistic scale such as 1-10 may be used. Therefore, fishing success may be reflected as a scale of 1-10, 1 being the worst of all fishing conditions, and 10 being the best of all fishing conditions measured at the time the instrument is being used.

Figure 1:
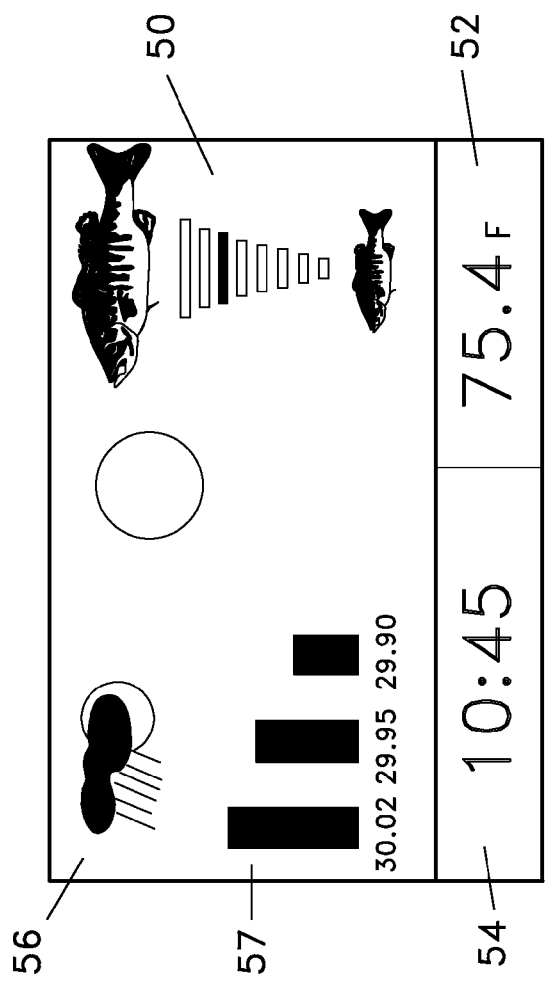
FIGS. 1 & 2 show one type of a display for two differing fishing conditions to illustrate an embodiment of the invention.
Figure 2:
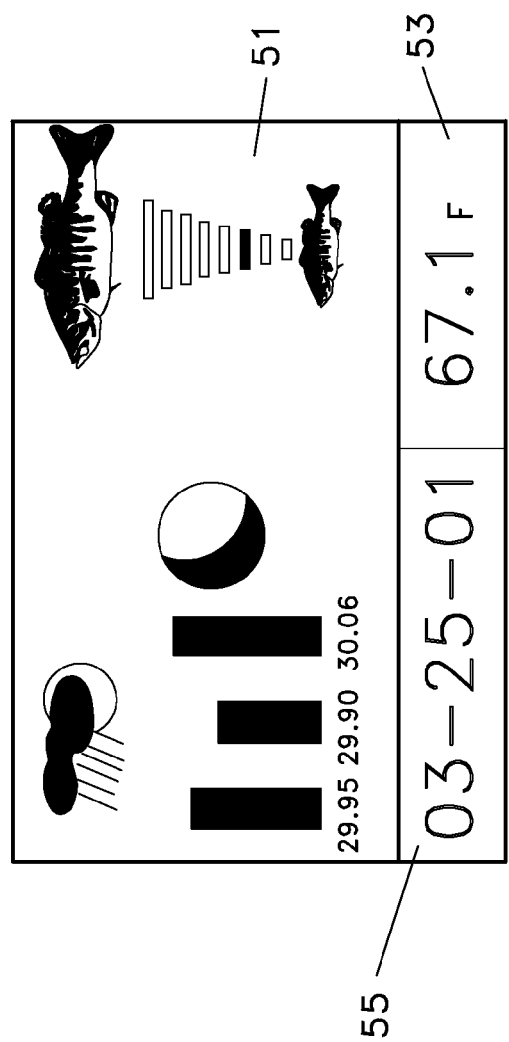

As can be seen from the drawings included in Exhibit C, a product specification, and from FIGS. 1 and 2, embodiments may present simplistic graphics through some type of simplistic graphics presentation element or subroutines. This may be for the ultimate prediction as well as for the individual items of information used to achieve the prediction. By using the term "simplistic", even a same symbol may be used for the various results or conditions, thus avoiding confusing users by positioning different displays at different locations. As shown, embodiments may graphically display moon phase through a single graphic display. As shown in the figures of Exhibit C, moon phase displays may be achieved through four phase indicias (26). Moon and sun position may also be shown and embodiments may graphically display lunar or solar position through a single graphic display. As shown in the figures of Exhibit C, moon and sun position displays may be achieved through eight position indicias (27). The display may also provide a user with a barometric pressure history indication such as through the barometric history display (28).

In designing the instrument, it may be designed to float, be weather resistant, or even may use a case such as that of a device known as an EB312. Functions such as those in devices known as a WS928 or WS2010 may also be included. A 24-hour barometric history may be used. User input to indicate a time zone may be included. External temperature probes of 30-40 feet so as to permit deep water readings may be included. Air temperature may be measured with an internal sensor. A carrying case may be included so the unit may be carried on a belt as well. As mentioned it may be designed as a hand-held device and may be electronically calculating through having the capabilities of an electronic calculational element (29). Control input functions may even be arranged to be temporarily inoperable through a temporary input disable element (30) such as a particular keystroke or on/off function.

As can be easily understood from the foregoing, the basic concepts of the present invention may be embodied in a variety of ways. It involves the techniques of indicating conditions as well as methods to accomplish the appropriate indications. In this application, the fishing condition calculation activity techniques are disclosed as part of the results shown to be achieved by the various devices described and as steps that are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The discussion included in this patent application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims.

It should also be understood that a variety of changes may be made without departing from the essence of the invention. Such changes are also implicitly included in the description. They still fall within the scope of this invention. Further, each of the various elements of the invention and claims may also be achieved in a variety of manners. This disclosure should be understood to encompass each such variation, be it a variation of an embodiment of any apparatus embodiment, a method or process embodiment of a calculational relationship, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action, which that physical element facilitates. Regarding this last aspect, as but one example, the disclosure of a "sensor" should be understood to encompass disclosure of the act of "sensing"—whether explicitly discussed or not—and, conversely, were there effectively only disclosure of the act of "sensing", such a disclosure should be understood to encompass disclosure of a "sensor" and even a "means for sensing." Such changes and alternative terms are to be understood to be explicitly included in the description.

References mentioned in this application for patent are hereby incorporated by reference and are hereby appended to it, however, as to each of the above, to the extent that such information or statements incorporated by reference might be considered inconsistent with the patenting of this/these invention(s) such statements are expressly not to be considered as made by the applicant(s).

As to each term used it should be understood that unless its utilization in this application is inconsistent with such interpretation, common dictionary definitions should be understood as incorporated for each term and all definitions, alternative terms, and synonyms such as contained in the Random House Webster's Unabridged Dictionary, second edition are hereby incorporated by reference.

It should be understood that the term "at least one" as used in the description and claims is not intended nor used in this disclosure to mean that other claims or descriptions not incorporating the "at least one" language cannot further include one or more like elements and the language "at least one" is not intended nor used to change "open-ended" claims, inherently including devices or methods having additional elements or steps apart from those claimed, into "closed-ended" claims wherein devices or methods having additional elements would not be covered by such claims. Further, if or when used, the use of the transitional phrase "comprising" (or its equivalent in Australia and the like, "including") is used to maintain the "open-end" claims herein, according to traditional claim interpretation. Thus, unless the context requires otherwise, it should be understood that the term "comprise", "include" (if or when inserted), or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible.

Thus, the support should be understood to exist to permit eventual claiming of at least: i) each of the sporting assessment embodiments herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products or results produced by such systems or components, ix) methods and apparatuses substantially as described herein, x) the various combinations and permutations of each of the elements disclosed, xi) processes performed with the aid of or on a computing device as described throughout the above discussion, xii) a programmable apparatus as described throughout the above discussion, xiii) a computer readable memory encoded with data to direct a computer comprising means or elements which function as described throughout the above discussion, xiv) a computer or computing device configured as herein disclosed and described, xv) individual or combined subroutines and programs as herein disclosed and described, xvi) the related methods disclosed and described, xvii) similar, equivalent, and even implicit variations of each of these systems and methods, xviii) those alternative designs which accomplish each of the functions shown as are disclosed and described, xix) those alternative designs and methods which accomplish each of the functions shown as are implicit to accomplish that which is disclosed and described, xx) each feature, component, and step shown as separate and independent inventions, xxi) the various combinations and permutations of each of the above and of any elements of each claim, and xxii) each dependent claim as a dependency on each and every one of the independent claims presented. In this regard it should be understood that for practical reasons and so as to avoid adding potentially hundreds of additional claims, the applicant has presented the claims with initial dependencies only. Support should be understood to exist to the degree required under new matter laws—including but not limited to European Patent Convention Article 123(2) and United States Patent Law 35 USC 132 or other such laws—to permit the addition of any of the various dependencies or other elements presented under one independent claim as dependencies or elements under any other independent claim.

Both all priority filing(s) and the claims set forth later in this specification by are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon. The claims initially presented are to be understood as also stating in this textual section of the specification, clauses and subject matter that are expressly designated by the applicant to be part of the description of embodiments of the invention. They may be used by the applicant to support any later claim(s) recited, amended, or reinserted in this patent application and may be used to support any claims recited in any subsequent continuation, continuation-in-part, or division patent application. Further, even if subsequently amended, cancelled, or otherwise altered, the claims originally set forth in this and the priority filing(s) are hereby incorporated by reference as part of this section, and the applicant expressly reserves the right to use all of or a portion of any of the content of such as additional description to support any claim or element, any amendment, and any component thereof. The content of this section (both listed and incorporated by reference) shall survive during the entire pendency of this application including any subsequent continuation, division, or continuation-in-part thereof or any reissue or extension thereon.

REFERENCES INCORPORATED BY REFERENCE

| DOC NO. | DATE | NAME | CLASS | SUB-CLASS | FILING DATE |
|---|---|---|---|---|---|
| 2,532,061 | Nov. 28, 1950 | Glick | 35 | 74 | Mar. 25, 1946 |
| 4,445,178 | Apr. 24, 1984 | Scheer, et al. | 364 | 400 | Aug. 18, 1981 |
| 5,208,790 | May 04, 1993 | Sato | 368 | 15 | Apr. 30, 1992 |

Provisional Application, 60/297,801, "System for Accessing Fishing Conditions", filed Jun. 12, 2001

As shown below, Table 1 is a table of one example of barometric factors for one fishing oriented embodiment; Table 2 is a spreadsheet of one example of temperature, lunar, solar, and barometric factors for one big game hunting oriented embodiment such as for deer or elk; and Table 3 is a product specification list with various displays and features listed.

TABLE 1

Sea Level Barometric Pressure Index
The index has 3 sets of values depending on the trend of pressure.
Following table shows the definition of pressure trend.

| Current Pressure - (−1 hour record) | Trend |
|---|---|
| <−2 mb | Falling |
| Between +/−2 mb | Steady |
| >=2 mb | Rising |

The index has 3 sets of values depending on the trend of pressure.

| inHg | Mb | Rising | Steady | Falling |
|---|---|---|---|---|
| <28 | <946 | 1 | 1 | 1 |
| 28 | 946 | 2.5 | 1 | 1 |
| 28.1 | 949 | 2.5 | 1 | 1 |
| 28.2 | 952 | 2.5 | 1 | 1 |
| 28.3 | 956 | 2.5 | 1 | 1 |
| 28.4 | 959 | 2.5 | 1 | 1 |
| 28.5 | 962 | 3 | 1.5 | 1.25 |
| 28.6 | 966 | 3 | 1.5 | 1.25 |
| 28.7 | 969 | 3 | 1.5 | 1.25 |
| 28.8 | 973 | 3 | 1.5 | 1.25 |
| 28.9 | 976 | 3 | 1.5 | 1.25 |
| 29 | 979 | 3.5 | 2 | 1.75 |
| 29.1 | 983 | 4 | 2.5 | 2.25 |
| 29.2 | 986 | 4.5 | 3 | 2.5 |
| 29.3 | 989 | 5 | 3.5 | 3 |
| 29.4 | 993 | 5.5 | 4 | 4 |
| 29.5 | 996 | 6 | 5 | 5.5 |
| 29.6 | 1000 | 6.5 | 6 | 7 |
| 29.7 | 1003 | 7 | 7 | 8 |
| 29.8 | 1006 | 7.5 | 8 | 9 |
| 29.9 | 1010 | 8 | 9 | 10 |
| 30 | 1013 | 8 | 9 | 10 |
| 30.1 | 1016 | 8 | 9 | 10 |
| 30.2 | 1020 | 7.8 | 8.6 | 9 |
| 30.3 | 1023 | 7.6 | 8.2 | 8 |
| 30.4 | 1027 | 7.4 | 7.8 | 7.5 |
| 30.5 | 1030 | 7 | 7.4 | 7 |
| 30.6 | 1033 | 6 | 7 | 6.5 |
| 30.7 | 1037 | 5 | 6.5 | 6 |
| 30.8 | 1040 | 4 | 6 | 5.75 |
| 30.9 | 1043 | 3.5 | 5 | 5.25 |
| 31 | 1047 | 3 | 4 | 5 |
| >31 | 1047 | 1 | 1 | 1 |

TABLE 2

| Temperature | Value | Sun Position | Value | Moon Position | Value | Moon Phase | Value |
|---|---|---|---|---|---|---|---|
| −24 | 1 | Rise − 3 hours | 3 | Rise − 4 hours | 2 | | |
| −23 | 1 | Rise − 2 hours | 5 | Rise − 3 hours | 4 | New − 2 | 10 |
| −22 | 1 | Rise − 1 hour | 10 | Rise − 2 hours | 6 | New − 1 | 10 |
| −21 | 1 | Rise (exact) | 10 | Rise − 1 hour | 8 | New (Exact) | 10 |
| −20 | 2 | Rise + 1 hour | 9 | Rise (exact) | 10 | New + 1 | 10 |

TABLE 2-continued

| | | | | | | | |
|---|---|---|---|---|---|---|---|
| −19 | 2 | Rise + 2 hours | 8 | Rise + 1 hour | 8 | New + 2 | 10 |
| −18 | 2 | Rise + 3 hours | 5 | Rise + 2 hours | 6 | | |
| −17 | 2 | Rise + 4 hours | 3 | Rise + 3 hours | 4 | Waxing Crescent − 1 | 3 |
| −16 | 3 | | | Rise + 4 hours | 2 | Waxing Crescent (Exact) | 3 |
| −15 | 3 | Set − 5 hours | 3 | | | Waxing Crescent + 1 | 3 |
| −14 | 3 | Set − 4 hours | 5 | Set − 4 hours | 2 | | |
| −13 | 3 | Set − 3 hours | 8 | Set − 3 hours | 4 | 1st Quarter − 1 | 6 |
| −12 | 4 | Set − 2 hours | 9 | Set − 2 hours | 6 | 1st Quarter (Exact) | 6 |
| −11 | 4 | Set − 1 hour | 10 | Set − 1 hours | 8 | 1st Quarter + 1 | 6 |
| −10 | 4 | Set (exact) | 10 | Set (Exact) | 10 | | |
| −9 | 4 | Set + 1 hour | 10 | Set + 1 hour | 8 | Waxing Gibb. − 1 | 3 |
| −8 | 5 | Set + 2 hours | 5 | Set + 2 hours | 6 | Waxing Gibb. (exact) | 3 |
| −7 | 5 | Set + 3 hours | 3 | Set + 3 hours | 4 | Waxing Gibb + 1 | 3 |
| −6 | 5 | | | Set + 4 hours | 2 | | |
| −5 | 5 | | | | | Full − 2 | 10 |
| −4 | 6 | | | | | Full − 1 | 10 |
| −3 | 6 | | | | | Full (Exact) | 10 |
| −2 | 6 | | | | | Full + 1 | 10 |
| −1 | 6 | | | | | Full + 2 | 10 |
| 0 | 7 | | | | | | |
| 1 | 7 | | | | | Waning Gibb. − 1 | 3 |
| 2 | 7 | | | | | Waning Gibb (Exact) | 3 |
| 3 | 7 | | | | | Waning Gibb + 1 | 3 |
| 4 | 8 | | | | | | |
| 5 | 8 | | | | | Last Quarter − 1 | 6 |
| 6 | 8 | | | | | Last Quarter (Exact) | 6 |
| 7 | 8 | | | | | Last Quarter + 1 | 6 |
| 8 | 9 | | | | | | |
| 9 | 9 | | | | | Waning Crescent − 1 | |
| 10 | 10 | | | | | Waning Crescent (Exact) | |
| 11 | 10 | | | | | Waning Crescent + 1 | |
| 12 | 10 | | | | | | |
| 13 | 9 | | | | | | |
| 14 | 9 | | | | | | |
| 15 | 8 | | | | | | |
| 16 | 8 | | | | | | |
| 17 | 8 | | | | | | |
| 18 | 7 | | | | | | |
| 19 | 7 | | | | | | |
| 20 | 7 | | | | | | |
| 21 | 6 | | | | | | |
| 22 | 6 | | | | | | |
| 23 | 5 | | | | | | |
| 24 | 5 | | | | | | |
| 25 | 4 | | | | | | |
| 26 | 4 | | | | | | |
| 27 | 3 | | | | | | |
| 28 | 3 | | | | | | |
| 29 | 2 | | | | | | |
| 30 | 2 | | | | | | |
| 31 | 1 | | | | | | |
| 32 | 1 | | | | | | |
| 33 | 1 | | | | | | |
| 34 | 1 | | | | | | |
| 35 | 1 | | | | | | |

| Barometric Pressure (Rising) | Value | Barometric Pressure (Falling) | Value | Barometric Pressure (Steady) | Value |
|---|---|---|---|---|---|
| 28 | 10 | 28 | 1 | 28 | 1 |
| 28.1 | 10 | 28.1 | 1 | 28.1 | 1 |
| 28.2 | 10 | 28.2 | 1 | 28.2 | 1 |
| 28.3 | 10 | 28.3 | 1 | 28.3 | 1 |

TABLE 2-continued

| | | | | | |
|---|---|---|---|---|---|
| 28.4 | 10 | 28.4 | 2 | 28.4 | 2 |
| 28.5 | 10 | 28.5 | 2 | 28.5 | 2 |
| 28.6 | 10 | 28.6 | 2 | 28.6 | 3 |
| 28.7 | 10 | 28.7 | 2 | 28.7 | 3 |
| 28.8 | 10 | 28.8 | 3 | 28.8 | 4 |
| 28.9 | 10 | 28.9 | 3 | 28.9 | 4 |
| 29 | 9 | 29 | 3 | 29 | 5 |
| 29.1 | 9 | 29.1 | 3 | 29.1 | 5 |
| 29.2 | 9 | 29.2 | 4 | 29.2 | 5 |
| 29.3 | 9 | 29.3 | 4 | 29.3 | 6 |
| 29.4 | 9 | 29.4 | 4 | 29.4 | 6 |
| 29.5 | 8 | 29.5 | 4 | 29.5 | 6 |
| 29.6 | 8 | 29.6 | 5 | 29.6 | 7 |
| 29.7 | 8 | 29.7 | 5 | 29.7 | 7 |
| 29.8 | 8 | 29.8 | 5 | 29.8 | 7 |
| 29.9 | 8 | 29.9 | 6 | 29.9 | 8 |
| 30 | 7 | 30 | 6 | 30 | 8 |
| 30.1 | 7 | 30.1 | 6 | 30.1 | 8 |
| 30.2 | 7 | 30.2 | 5 | 30.2 | 7 |
| 30.3 | 7 | 20.3 | 5 | 20.3 | 7 |
| 30.4 | 6 | 30.4 | 5 | 30.4 | 7 |
| 30.5 | 6 | 30.5 | 5 | 30.5 | 6 |
| 30.6 | 6 | 30.6 | 5 | 30.6 | 6 |
| 30.7 | 6 | 30.7 | 5 | 30.7 | 6 |
| 30.8 | 5 | 30.8 | 5 | 30.8 | 5 |
| 30.9 | 5 | 30.9 | 5 | 30.9 | 5 |
| 31 | 5 | 31 | 5 | 31 | 5 |

PRESENT HUNT VALUE = .25 TemperatureValue + .40 SunPositionValue + .075 * MoonPositionValue + .075 * MoonPhaseValue + .20 * BarometricPressureValue FUTURE HUNT VALUE = .70 SunPositionValue + .15 * MoonPositionValue + .15 * MoonPhaseValue

TABLE 3

Features/Specification
Fishing Buddy provides fish feeding forecast based on barometric pressure, moon phase, moon position & sun position.

2 line LCD display

"PRESENT" MODE

Default display on the 1$^{st}$ line
    "Present" icon
    Moon phase
    Weather forecast
    Moon and Sun position
    Fish feeding meter (10 horizontal bars)
"Time" display mode
    1$^{st}$ line: Feeding Forecast bar chart
    2$^{nd}$ line: Clock (HH:MM) in 12/24 hr format
"Date" display mode
    1$^{st}$ line: Feeding Forecast bar chart
    2$^{nd}$ line: Calendar (MM:DD) (bonding option: DD:MM format)
"Baro" display mode
    1$^{st}$ line: Barometric pressure historical bar chart
    2$^{nd}$ line: Barometric pressure (Unit: mb or inHg)
"Sunrise" and "Sunset" display modes
    1$^{st}$ line: Feeding Forecast bar chart
    2$^{nd}$ line: Sunrise/Sunset time (HH:MM) in 12/24 hour format

"FUTURE" MODE

Default display on the 1$^{st}$ line
    "Future" icon
    Fish Feeding Forecast bar chart
    Moon phase
    Moon and Sun position
    Fish Feeding meter (10 horizontal bars)
"Time" display mode
    2$^{nd}$ line: Clock (HH:MM) in 12/24 hr format
"Date" display mode
    2$^{nd}$ line: Calendar (MM:DD) (bonding option: DD:MM format)
"Sunrise" and "Sunset" display modes
    2$^{nd}$ line: Sunrise/Sunset time (HH:MM) in 12/24 hour format TABLE 3-continued

"PRESENT" SETTING MODE

Default display on the 1$^{st}$ line
  Flashes "Present" icon (All other icon off)
 "Time" display setting mode
 2$^{nd}$ line: Set 12/24 Hr format; Hour; Minute
 "Date" display setting mode
 2$^{nd}$ line: Set Month; Day; Year
 "Baro" display setting mode
 2$^{nd}$ line: Set Barometric pressure unit (mb or inHg)
 "T.Zone" display setting mode
 2$^{nd}$ line: Set time zone (ie. local time - GMT time)
 "Alt" display setting mode
 2$^{nd}$ line: Set altitude in meter for barometric pressure compensation
 "Lat" display setting mode
 2$^{nd}$ line: Set latitude in Degree; North or South
 "Lon" display setting mode
 2$^{nd}$ line: Set Longitude in Degree; East or West

"FUTURE" SETTING MODE

Default display on the 1$^{st}$ line
  Flashes "Future" icon (All other icon off)
 "Time" display setting mode
 2$^{nd}$ line: Set Hour; Minute
 "Date" display setting mode
 2$^{nd}$ line: Set Month; Day; Year Relative Barometric Pressure Measurement Weather Forecast includes Sunny, Partly cloudy, Cloudy and Rainy
Severe weather audio alarm when pressure rises or falls 6 mb in 3 hours. It
beeps for 5 seconds and flashes the Rainy weather forecast icons at the same
time when the alarm is activated, (Default alarm setting: Enabled) (*** Any key
press during the 5 seconds will stop the alarm sound)
Alarm sound level: minimum 70 dB at 5 cm distance
User selectable pressure unit: mb or inHg (Default setting: inHg)
Altitude input in meter for relative barometric pressure compensation
Altitude compensation range: −100 meter to 1700 meter
Barometric pressure sensing cycle: Around every 15 minutes
Barometric pressure measuring range: 795 mb to 1050 mb (23.48 inHg to
31.01 inHg)
Pressure Resolution: 1 mb or 0.03 inHg
Pressure accuracy: +/−7 mb or +/−0.21 inHg
Pressure bar chart in 4 columns × 5 Rows
Barometric pressure history for the last 16 hour pressure memory Moon Phase, Sun & Moon position 8 Moon phase symbols including full, waning, quarter, waxing and new
Moon phase scanner for year 2000 to 2100
8 Moon positions including rising, setting, overhead and underfoot
Programmable latitude, longitude and time zone (local time - GMT time) to
determine the moon and sun position value. (The latitude & longitude are input
as degree only)

Fish Feeding Forecast

The overall fishing conditions are reflected on the fishing meter with 10
horizontal bars. The bars will darken higher on the scale as fish feeding forecast
improves.
 The general formula for feeding forecast in "Present" mode
 0.294B + 0.235M + 0.235P + 0.235S = Fish Feeding Forecast
 The general formula for feeding forecast in "Future" mode
 0.33M + 0.33P + 0.33S = Fish Feeding Forecast
 where;
 B = Barometric pressure value
 M = Moon phase value
 P = Moon position value
 S = Sun position value Calendar Clock Clock display with HH:MM format
User selectable 12/24 hour format (Default 12 hour format)
Default Month-Day-Year format (Bonding option: Day-Month-Year format)

Battery information

Low battery indication
Use 2 pieces of CR2032 Lithium 3 V battery
Battery life: Around 8 months TABLE 3-continued Others Green HiGlo backlight for easy reading in the dark.
Key lock function
EEPROM IC memory storage for 12/24 hour format, barometric pressure unit,
time zone, altitude, latitude, longitude and weather alarm status
(enabled/disabled) after batteries have been removed
An inexpensive pouch with lanyard is included in the package to carry the main
unit
Wall mount bracket for wall mounting
Water resistance: JIS3

Key Operations

Front Control Panel

[MODE/Power] Button
  "Present" mode:
    Press to toggle between "Time", "Date", "Baro", "Sunrise" and "Sunset"
    display mode
    Press and hold for 2 seconds to power on/off the unit
  "Future" mode:
    Press to toggle between "Time", "Date", "Sunrise" and "Sunset" display
    mode
    Press and hold for 2 seconds to power on/off the unit
[Time/Key lock] Button
  Press to toggle between "Present" and "Future" mode
  Press and hold for 2 seconds to lock/unlock the front key operation
[Set] Button
  In "Present" mode, press and hold for 2 seconds to enter "Present" setting
  mode
  In "Future" mode, press and hold for 2 seconds to enter "Future" setting mode
  Press to activate EL backlight for 6 seconds
[Up] buttons
  Increment the flashing item in setting mode
  Press and hold for more than 1 second for fast increment in setting mode
  Any press of [Up] button in normal or setting mode will activate EL backlight
  for 6 seconds
  Press and hold for 3 seconds in normal mode will enable the severe weather
  alarm function and beep 4 times in 2 seconds
[Down] buttons
  Decrement the flashing item in setting mode
  Press and hold for more than 1 second for fast decrement in setting mode
  Any press of [Down] button in normal or setting mode will activate EL
  backlight for 6 seconds
  Press and hold for 3 seconds in normal mode will disable the severe weather
  alarm function and beep once Battery compartment

[RESET] Button
  To activate system reset to the unit during abnormal condition.

The invention claimed is:

1. A method of temporally predicting sporting success comprising the steps of:
   providing a computing device having computer readable memory;
   determining at least some sporting location determinative information with said computing device;
   assessing at least some date information with said computing device;
   assessing at least some lunar information based upon said date information with said computing device;
   assessing at least some solar information based upon said date information with said computing device;
   assessing at least some barometric information with said computing device;
   combining said lunar information and said solar information and said barometric information to create a composite barometric-lunar-solar effect with said computing device; and
   utilizing said composite barometric-lunar-solar effect in predicting sport success with said computing device; and
   displaying said sport success on said computing device.

2. A method of temporally predicting sporting success as described in claim 1 wherein said step of assessing at least some barometric information comprises the steps of:
   sensing at least some barometric information; and
   automatically factoring said at least some barometric information into said step of combining said barometric information with said lunar information and said solar information to create a composite barometric-lunar-solar effect.

3. A method of temporally predicting sporting success as described in claim 1 wherein said step of assessing at least some barometric information comprises the step of establishing a success event factor selected from a group consisting of success event factors which are: highest for a falling barometric pressure value, lesser for a steady barometric pressure value, and lesser yet for a rising barometric pressure value, each when in the most favorable range of pressures; highest for a rising barometric pressure value, lesser for a steady barometric pressure value, and lesser yet for a falling barometric pressure value, each when in a range of pressures which are lower than the most favorable range of pressures; and highest for a steady barometric pressure value, lesser for a falling barometric pressure value, and lesser yet for a rising barometric pressure value, each when in a range of pressures which are higher than the most favorable range of pressures.

4. A method of temporally predicting sporting success as described in claim 1 and further comprising the step of forecasting a sport success prediction for a future time.

5. A method of temporally predicting sporting success as described in claim 4 and further comprising the step of accepting an input for a future time and date.

6. A method of temporally predicting sporting success as described in claim 4 wherein said step of forecasting a sport success prediction for a future time comprises the step of utilizing different criteria than utilized for a present time.

7. A method of temporally predicting sporting success as described in claim 3 wherein said step of utilizing said composite lunar-solar effect in predicting sport success comprises the step of equally weighting a lunar position factor, a lunar phase factor, and a solar position factor.

8. A method of temporally predicting sporting success comprising the steps of:
   providing a computing device having computer readable memory;
   determining at least some sporting location determinative information with said computing device;
   assessing at least some date information with said computing device;
   assessing at least some lunar information based upon said date information with said computing device;
   assessing at least some barometric information with said computing device;
   combining said barometric information with said lunar information to create a composite barometric-lunar effect with said computing device; and
   utilizing said composite barometric-lunar effect to predict sport success with said computing device; and
   displaying said sport success on said computing device.

9. A method of temporally predicting sporting success as described in claim 8 and further comprising the steps of:
   estimating a weather forecast character;
   displaying said weather forecast character to a user.

10. A method of temporally predicting sporting success as described in claim 8 and further comprising the step of automatically alerting said user of a potentially severe weather condition.

11. A method of temporally predicting sporting success as described in claim 10 and further comprising the step of calculating a rate of barometric pressure change.

12. A method of temporally predicting sporting success as described in claim 8 wherein said step of assessing at least some barometric information comprises the steps of:
   sensing at least some barometric information; and
   automatically factoring said at least some barometric information into said step of combining said barometric information with said lunar information to create a composite barometric-lunar effect.

13. A method of temporally predicting sporting success as described in claim 12 wherein said step of assessing at least some barometric information further comprises the step of comparing said sensed barometric information to historical barometric information.

14. A method of temporally predicting sporting success as described in claim 12 wherein said step of assessing at least some barometric information further comprises the step of establishing at least one barometric influenced maximum success event factor.

15. A method of temporally predicting sporting success comprising the steps of:
   providing a computing device having computer readable memory;
   determining at least some sporting location determinative information with said computing device;
   assessing at least some date information with said computing device;
   assessing at least some solar information based upon said date information with said computing device;
   assessing at least some lunar information based upon said date information with said computing device;
   electronically utilizing said solar information and said lunar information to create a combined lunar-solar effect with said computing device; and
   utilizing said combined lunar-solar effect in predicting sport success with said computing device; and
   displaying said sport success on said computing device.

16. A method of temporally predicting sporting success as described in claim 15 wherein said step of determining at least some sporting location determinative information comprises the step of accepting latitude and longitude inputs.

17. A method of temporally predicting sporting success as described in claim 15 wherein said step of determining at least some sporting location determinative information comprises the step of accepting a time zone input.

18. A method of temporally predicting sporting success as described in claim 15 wherein said step of determining at least some sporting location determinative information comprises the step of accepting a nearby location input.

19. A method of temporally predicting sporting success as described in claim 15 wherein said step of determining at least some sporting location determinative information comprises the step of accepting a state input.

20. A method of temporally predicting sporting success as described in claim 15 wherein said step of assessing at least some solar information comprises the steps of:
   calculating said at least some solar information; and
   automatically factoring said at least some solar information into said step of automatically utilizing said solar information to create a solar effect.

* * * * *